United States Patent
Godfrey et al.

(10) Patent No.: US 9,120,151 B2
(45) Date of Patent: Sep. 1, 2015

(54) METHODS FOR MANUFACTURING TITANIUM ALUMINIDE COMPONENTS FROM ARTICLES FORMED BY CONSOLIDATION PROCESSES

(75) Inventors: Donald G. Godfrey, Phoenix, AZ (US); Mark C. Morris, Phoenix, AZ (US); George Reimer, Simpsonville, SC (US); William F. Hehmann, Spartanburg, SC (US); Daira Legzdina, Phoenix, AZ (US); Richard Fox, Mesa, AZ (US); Yiping Hu, Greer, SC (US); Harry Lester Kington, Scottsdale, AZ (US)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 151 days.

(21) Appl. No.: 13/564,656

(22) Filed: Aug. 1, 2012

(65) Prior Publication Data

US 2014/0037983 A1 Feb. 6, 2014

(51) Int. Cl.
*C23C 16/06* (2006.01)
*C23C 16/48* (2006.01)
(Continued)

(52) U.S. Cl.
CPC .............. *B22F 3/1266* (2013.01); *B22F 3/15* (2013.01); *C22C 1/0491* (2013.01); *C23C 10/48* (2013.01); *C23C 10/60* (2013.01); *C23C 14/16* (2013.01);
(Continued)

(58) Field of Classification Search
CPC .......... C23C 16/06; C23C 16/48; B05D 3/12; B05D 7/14
USPC ............... 427/250, 255.29, 255.31, 355, 369
See application file for complete search history.

(56) References Cited

U.S. PATENT DOCUMENTS 4,145,481 A 3/1979 Gupta et al.
4,198,442 A 4/1980 Gupta et al.
(Continued)

FOREIGN PATENT DOCUMENTS

DE 2104062 A1 8/1972
DE 102008056336 A1 5/2010
(Continued)

OTHER PUBLICATIONS

Kothari, K., et al., "Microstructure and mechanical properties of consolidated gamma titanium aluminides". Powder Metallurgy, 2007, vol. 50, No. 1, pp. 21-27.*
(Continued)

*Primary Examiner* — Bret Chen
(74) *Attorney, Agent, or Firm* — Ingrassia Fisher & Lorenz, P.C.

(57) ABSTRACT

Substantially defect-free titanium aluminide components and methods are provided for manufacturing the same from articles formed by consolidation processes. The method includes providing an intermediate article comprised of a titanium aluminide alloy and formed by a consolidation process. The intermediate article is encapsulated with an aluminum-containing encapsulation layer. The intermediate article is compacted after the encapsulation step. A substantially defect-free titanium aluminide component comprises a compacted three-dimensional article comprised of titanium aluminide and formed by a consolidation process and an aluminum-containing encapsulation layer on at least one surface of the compacted three-dimensional article. The aluminum-containing encapsulation layer comprises an aluminide material, MCrAlY wherein M is cobalt, nickel, or a combination of cobalt and nickel, or TiAlCr.

18 Claims, 9 Drawing Sheets

(51) Int. Cl.

| | | |
|---|---|---|
| B05D 3/12 | (2006.01) | |
| B05D 7/14 | (2006.01) | |
| B22F 3/12 | (2006.01) | |
| B22F 3/15 | (2006.01) | |
| C23C 10/48 | (2006.01) | |
| C23C 10/60 | (2006.01) | |
| C22C 1/04 | (2006.01) | |
| C23C 14/16 | (2006.01) | |
| B22F 3/105 | (2006.01) | |

(52) U.S. Cl.
CPC ........ *B22F 3/1055* (2013.01); *Y10T 428/12764* (2015.01)

(56) References Cited

U.S. PATENT DOCUMENTS

| | | |
|---|---|---|
| 4,382,976 A | 5/1983 | Restall |
| RE31,339 E | 8/1983 | Dardi et al. |
| 4,499,048 A | 2/1985 | Hanejko |
| 4,687,678 A | 8/1987 | Lindblom |
| 4,818,562 A | 4/1989 | Arcella et al. |
| 5,096,518 A | 3/1992 | Fujikawa et al. |
| 5,106,266 A | 4/1992 | Borns et al. |
| 5,128,179 A | 7/1992 | Baldi |
| 5,236,116 A | 8/1993 | Solanki et al. |
| 5,249,785 A | 10/1993 | Nelson et al. |
| 5,465,780 A | 11/1995 | Muntner et al. |
| 5,514,482 A | 5/1996 | Strangman |
| 5,634,992 A * | 6/1997 | Kelly et al. .................... 148/669 |
| 5,640,667 A | 6/1997 | Freitag et al. |
| 5,650,235 A | 7/1997 | McMordie et al. |
| 5,745,834 A | 4/1998 | Bampton et al. |
| 5,837,960 A | 11/1998 | Lewis et al. |
| 5,851,409 A | 12/1998 | Schaeffer et al. |
| 5,947,179 A | 9/1999 | Kinane et al. |
| 6,049,978 A | 4/2000 | Arnold |
| 6,154,959 A | 12/2000 | Goodwater et al. |
| 6,172,327 B1 | 1/2001 | Aleshin et al. |
| 6,174,448 B1 | 1/2001 | Das et al. |
| 6,269,540 B1 | 8/2001 | Islam et al. |
| 6,270,914 B1 | 8/2001 | Ogasawara et al. |
| 6,355,116 B1 | 3/2002 | Chen et al. |
| 6,447,924 B1 * | 9/2002 | Bettridge ..................... 428/469 |
| 6,485,848 B1 | 11/2002 | Wang et al. |
| 6,504,127 B1 | 1/2003 | McGregor et al. |
| 6,568,077 B1 | 5/2003 | Hellemann et al. |
| 6,575,349 B2 | 6/2003 | Van Esch |
| 6,676,892 B2 | 1/2004 | Das et al. |
| 6,758,914 B2 | 7/2004 | Kool et al. |
| 6,838,191 B1 | 1/2005 | Raj |
| 6,884,461 B2 | 4/2005 | Ackerman et al. |
| 6,969,457 B2 | 11/2005 | MacDonald et al. |
| 7,216,428 B2 | 5/2007 | Memmen et al. |
| 7,270,764 B2 | 9/2007 | Wustman et al. |
| 7,651,658 B2 | 1/2010 | Aimone et al. |
| 7,794,800 B2 | 9/2010 | Clark et al. |
| 7,829,142 B2 | 11/2010 | Kool et al. |
| 2001/0014403 A1 | 8/2001 | Brown et al. |
| 2003/0037436 A1 | 2/2003 | Ducotey, Jr. et al. |
| 2003/0088980 A1 | 5/2003 | Arnold |
| 2003/0217915 A1 * | 11/2003 | Ouellet et al. ........... 204/192.15 |
| 2004/0096350 A1 * | 5/2004 | Moxson et al. ................ 419/38 |
| 2004/0096690 A1 | 5/2004 | Kelly et al. |
| 2005/0036892 A1 | 2/2005 | Bajan |
| 2005/0091848 A1 | 5/2005 | Nenov et al. |
| 2005/0133527 A1 | 6/2005 | Dullea et al. |
| 2006/0138200 A1 * | 6/2006 | Oehring et al. ............... 228/178 |
| 2006/0177582 A1 | 8/2006 | Chandra et al. |
| 2006/0222776 A1 | 10/2006 | Madhava et al. |
| 2007/0000772 A1 * | 1/2007 | Ramm et al. ............ 204/192.38 |
| 2007/0084047 A1 | 4/2007 | Lange et al. |
| 2007/0107202 A1 * | 5/2007 | Das .............................. 29/527.7 |
| 2008/0014457 A1 | 1/2008 | Gennaro et al. |
| 2008/0290215 A1 | 11/2008 | Udall et al. |
| 2008/0304975 A1 | 12/2008 | Clark et al. |
| 2009/0081066 A1 | 3/2009 | Illston |
| 2009/0200275 A1 | 8/2009 | Twelves et al. |
| 2009/0255602 A1 | 10/2009 | McMasters et al. |
| 2010/0021289 A1 | 1/2010 | Grylls et al. |
| 2010/0025001 A1 | 2/2010 | Lee et al. |
| 2010/0028158 A1 | 2/2010 | Richter |
| 2010/0065142 A1 | 3/2010 | McMasters et al. |
| 2010/0200189 A1 | 8/2010 | Qi et al. |
| 2010/0221567 A1 | 9/2010 | Budinger et al. |
| 2011/0106290 A1 | 5/2011 | Hövel et al. |
| 2011/0135952 A1 | 6/2011 | Morris et al. |
| 2011/0311389 A1 | 12/2011 | Ryan et al. |
| 2012/0034101 A1 | 2/2012 | James et al. |

FOREIGN PATENT DOCUMENTS

| | | |
|---|---|---|
| EP | 0861919 A2 | 9/1998 |
| GB | 2279667 A | 1/1995 |
| JP | 5104259 A | 4/1993 |
| WO | 97/19776 A1 | 6/1997 |
| WO | 2008034413 A1 | 3/2008 |
| WO | 2008046387 A1 | 4/2008 |

OTHER PUBLICATIONS

Wang, G.-X., et al., "TiAl-based high temperature materials made from extremely deformed elemental powders". Journal de Physique IV, Colloque C7, supplement au Journal de Physique III, vol. 3, Nov. 1993, pp. 469-472.*

Friel, R.J., et al., "Ultrasonic additive manufacturing—A hybrid production process for novel functional products". Procedia CIRP 6 (2013) 35-40.*

Gu, D.D., et al., "Laser additive manufacturing of metallic components: materials, processes and mechanisms". International Materials Reviews 2012, vol. 57, No. 3, pp. 133-164.*

Mittendorf, et al.; Methods for Repairing Turbine Components, U.S. Appl. No. 13/041,113, filed Mar. 4, 2011.

Hussain et al.; Advanced Nanocomposites for High Temperature Aero-Engine/Turbine Components, Inderscience Publishers, International Journal of Nanomanufacturing; vol. 4, No. 1-4, 2009, pp. 248-256. Retrieved from Internet: <URL:www.inderscience.com>.

Mainier et al.; On the Effect of the Electroless Nickel-Phosphorus Coating Defects on the Performance of This Type of Coating in Oilfieled Environments, OnePetro, SPE Advanced Technology Series; vol. 2, No. 1, Mar. 1994.

Bi et al.; Feasibility Study on the Laser Aided Additive Manufacturing of Die Inserts for Liquid Forging, ScienceDirect.

Groth et al.; New Innovations in Diode Laser Cladding, Fraunhofer USA—Center for Surface and Laser Processing.

Clark et al.; Shaped Metal Deposition of a Nickel Alloy for Aero Engine Applications, SciencetDirect.

Electroless Nickel, New Hampshire Materials Laboratory, Inc.

Ryan, et al.; Methods for Manufacturing Turbine Components, filed with the USPTO Jun. 22, 2010, and assigned U.S. Appl. No. 12/820,652.

USPTO Non-final Office Action for U.S. Appl. No. 12/820,652; notification date Mar. 16, 2012.

USPTO Final Office Action for U.S. Appl. No. 12/820,652; notification date Jul. 13, 2012.

USPTO Office Action for U.S. Appl. No. 13/041,113 dated Sep. 13, 2013.

USPTO Office Action for U.S. Appl. No. 13/041,113; Notification date Apr. 15, 2014.

Szuromi, et al.; Methods for Manufacturing Components from Articles Formed by Additive-Manufacturing Processes, filed with the USPTO Sep. 16, 2011 and assigned U.S. Appl. No. 13/265,210.

USPTO Office Action for U.S. Appl. No. 13/041,113 dated May 23, 2013.

USPTO Notice of Allowance for U.S. Appl. No. 13/235,210 dated Jun. 7, 2013.

USPTO Office Action for U.S. Appl. No. 13/964,866; Notification date May 9, 2014.

(56) References Cited

OTHER PUBLICATIONS

Godfrey, D. G., et al.: "Multi-Material Turbine Components" filed with the USPTO on Jan. 27, 2012 and assigned U.S. Appl. No. 13/360,126.

Loeber, L., et al.; Comparison of Selective Laser and Electron Beam Melted Titanium Aluminides, published Sep. 24, 2011, pp. 547-556.

EP Search Report for Application No. 12 184 142.3 dated Feb. 6, 2013.

USPTO Office Action, Notification Date Nov. 14, 2014; U.S. Appl. No. 13/964,866.

USPTO Office Action; Notification Date Dec. 22, 2014 for U.S. Appl. No. 13/360,126.

USPTO Notice of Allowance; Notification Date Jan. 23, 2015 for U.S. Appl. No 13/964,866.

USPTO Notice of Allowance Notification Date Mar. 6, 2015 for U.S. Appl. No. 13/041,113.

USPTO Office Action Notification Date Mar. 27, 2015 for U.S. Appl. No. 12/820,652.

EP Search Report for Application No. 12157966.8 dated Mar. 17, 2015.

Aziz, I., "Microstructure and Mechanical Properties of TI-6AL-4V Produced by Selective Laser Sintering of Prealloyed Powders," The University of Waikato, May 14, 2010.

Dasa, S., "Direct laser fabrication of superalloy cermet abrasive turbine blade tips" Elsevier Science Ltd, 2000.

EP Communication for EP 12157966.8-1709 dated Apr. 28, 2015.

\* cited by examiner

METHODS FOR MANUFACTURING TITANIUM ALUMINIDE COMPONENTS FROM ARTICLES FORMED BY CONSOLIDATION PROCESSES

TECHNICAL FIELD

The present invention generally relates to titanium aluminide components and methods for manufacturing the same, and more particularly relates to substantially defect-free titanium aluminide components and methods for manufacturing the same from articles formed by consolidation processes.

BACKGROUND

Components with relatively complex three-dimensional (3D) geometries may raise difficult fabrication issues. Gas turbine engine components may have relatively complex three-dimensional (3D) geometries, including components with internal surfaces defining internal passages including internal hollow areas, internal channels, internal openings, or the like (collectively referred to herein as "internal passages") for cooling, weight reduction, or otherwise. Additive manufacturing (AM) processes (including those which form "cores" for subsequent conventional casting) as well as other powder consolidation processes such as wrought/forgings, metal injection moldings (MIM), etc. have been developed to manufacture components having relatively complex three dimensional geometries. As used herein, the term "powder consolidation process" refers to a process in which a powdered build material is used to form an intermediate article that is used to manufacture the final component. The powdered build material is densified with bonding between adjacent atoms. Consolidation processes other than powder consolidation processes (e.g., a liquid media consolidation process, a wire feedstock consolidation process, or the like) have also been used to form an intermediate article that is used to manufacture the final component.

Intermediate articles formed from powder consolidation processes and other consolidation processes may have significant surface porosity and cracks (hereinafter "surface-connected defects"), and internal porosity and cracks (hereinafter "internal defects"). For high performance engine components that operate at high stresses and in high temperature environments, and that must endure hot flow path gases and may endure high turbine rotational speeds (e.g., in the case of rotating turbine engine components), such surface-connected and internal defects (collectively referred to herein as "defects") are unacceptable as the structural integrity, cosmetic appearance, functionality, and mechanical properties (i.e., the "metallurgical quality") of the component manufactured from such intermediate article may be compromised.

Conventional encapsulation and subsequent hot isostatic pressing (HIP) processing of nickel- and cobalt-based superalloy articles formed by additive-manufacturing processes have resulted in components with reduced defects, but the manufacture of substantially defect-free titanium aluminide components from articles formed by additive-manufacturing processes and other consolidation processes still needs improvement. As used herein, the term "substantially defect-free" refers to a titanium aluminide component in which greater than 95% of the defects (both surface-connected and internal defects) present in the intermediate article have been eliminated.

In general, titanium aluminide alloys are lightweight when compared to nickel-based superalloys which have approximately twice the density of titanium aluminide. Titanium aluminide alloys can maintain their structural integrity (excellent creep (time to 0.5% strain) properties (930 hours @ 40 ksi for Howmet Ti-47Al-2Nb-1Mn-0.5W-0.5Mo-0.2Si (W—Mo—Si Alloy or WMS-Cast+HIP+HTT 1850° F.) during high temperatures (up to about 900° C. for Ti-43.5Al-4Nb-1Mo-0.1B (TNMB1)), and are therefore particularly desirable for manufacturing high performance components, such as turbine engine components. The use of titanium aluminide alloy as a superalloy replacement in manufacturing turbine engine components can significantly reduce engine weight, resulting in significant fuel savings and other benefits. However, titanium aluminide alloys have generally proved difficult to process, have limited heat treatability, and generally have low ductility (2%) when compared to Inconel 718 (3%) at room temperature (about 25 to about 35° C.). For example, the relatively low ductility of titanium aluminide alloys as compared with nickel- and cobalt-based superalloys combined with the very nature of a powder consolidation process in which titanium aluminide powders may be sintered (fused) to form the article results in significant cracking and porosity that are not sufficiently reduced by conventional encapsulation and HIP processing.

Accordingly, it is desirable to provide substantially defect-free titanium aluminide components and methods for manufacturing the same from articles formed by consolidation processes. Furthermore, other desirable features and characteristics of the present invention will become apparent from the subsequent detailed description of the invention and the appended claims, taken in conjunction with the accompanying drawings and this background of the invention.

BRIEF SUMMARY

Methods are provided for manufacturing a titanium aluminide component. In accordance with one exemplary embodiment, the method comprises providing an intermediate article comprised of a titanium aluminide alloy and formed by a consolidation process. The intermediate article is encapsulated with an aluminum-containing encapsulation layer. The intermediate article is compacted after the encapsulation step.

Methods are provided for manufacturing a titanium aluminide component from an intermediate article formed by a consolidation process in accordance with yet another exemplary embodiment of the present invention. The method comprises encapsulating the intermediate article with an aluminum-containing encapsulation layer to form an encapsulated article. The intermediate article is comprised of a titanium aluminide alloy material. The aluminum-containing encapsulation layer comprises an aluminide encapsulation layer, a MCrAlY encapsulation layer wherein the M comprises nickel, cobalt, or a combination of nickel and cobalt, or a TiAlCr encapsulation layer. The encapsulated article is compacted.

Substantially defect-free titanium aluminide components are provided in accordance with yet another exemplary embodiment of the present invention. The component is comprised of a compacted three-dimensional article comprised of titanium aluminide and formed by a consolidation process and an aluminum-containing encapsulation layer on at least one surface of the compacted three-dimensional article. The aluminum-containing encapsulation layer comprises an aluminide, MCrAlY wherein M is cobalt, nickel, or a combination of cobalt and nickel, or TiAlCr.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. As used herein, the term "exemplary" means serving as an example, instance, or illustration. Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, brief description of the drawings, or the following detailed description.

Various exemplary embodiments are directed to titanium aluminide components and methods for manufacturing the same from articles formed by known consolidation processes. The titanium aluminide components are three-dimensional and may be solid or have internal passages as hereinafter described. As used herein, the term "a powder consolidation process" refers to, for example, an additive manufacturing process such as electron beam melting or direct metal laser fusion in which sequential deposit layers of powdered build material are fused and solidified according to a three-dimensional (3D) model. Other additive manufacturing processes and consolidation processes may also be employed. As noted previously, the as-built article (hereinafter referred to as an "intermediate article") formed by a consolidation process may have internal porosity and cracks (hereinafter "internal defects") and surface porosity and cracks (hereinafter "surface-connected defects") (the internal defects and surface-connected defects are referred to collectively herein as simply "defects"). The term "internal defects" also includes interface defects such as bond failures and cracks at the interfaces between successive cross-sectional layers, a problem often referred to as "delamination." The cracks develop at interfaces or cut through or across deposit layers due to stresses inherent with the powder consolidation process and/or metallurgy of the build material. The term "surface-connected defects" as used herein includes porosity and cracks that are connected to the surface of the article. According to exemplary embodiments as described herein, the intermediate article is encapsulated such that the surface-connected defects are effectively converted into internal defects, i.e., an aluminum-containing encapsulation layer effectively converts the surface-connected defects into internal defects. The encapsulated article then undergoes a compaction process such as a hot isostatic pressing (HIP) process to substantially eliminate the internal defects, as well as any final treatments, to produce a substantially defect-free titanium aluminide component or simply "finished component". As used here, the term "substantially defect-free" refers to a component in which greater than 95% of the defects (both surface-connected and internal defects) present in the intermediate article have been eliminated. The substantially defect-free titanium aluminide component is able to operate at high stresses (greater than 400 Mpa) and in high temperature environments (i.e., at temperatures up to about 900° C.), able to endure hot flow path gases (i.e., flow path gases at temperatures up to about 900° C.) and high turbine rotational speeds (i.e., turbine rotational speeds between 0 to 90,000 rpm) if necessary.

While the advantages of the present invention as described herein will be described with reference to a turbine component (a high pressure turbine blade shown in FIGS. 2, and 4-12) manufactured from an intermediate article formed by a powder consolidation process, the teachings of the present invention are generally applicable to any component manufactured from an intermediate article formed by a consolidation process (powder, liquid media, or wire feedstock consolidation process) and may be used to reduce surface-connected and internal defects to improve the metallurgical quality of the component. Exemplary components include, but are not limited to, static and rotating turbine components, medical devices, weapons, and custom low volume components for internal combustion racing engines, etc.

Figure 1:
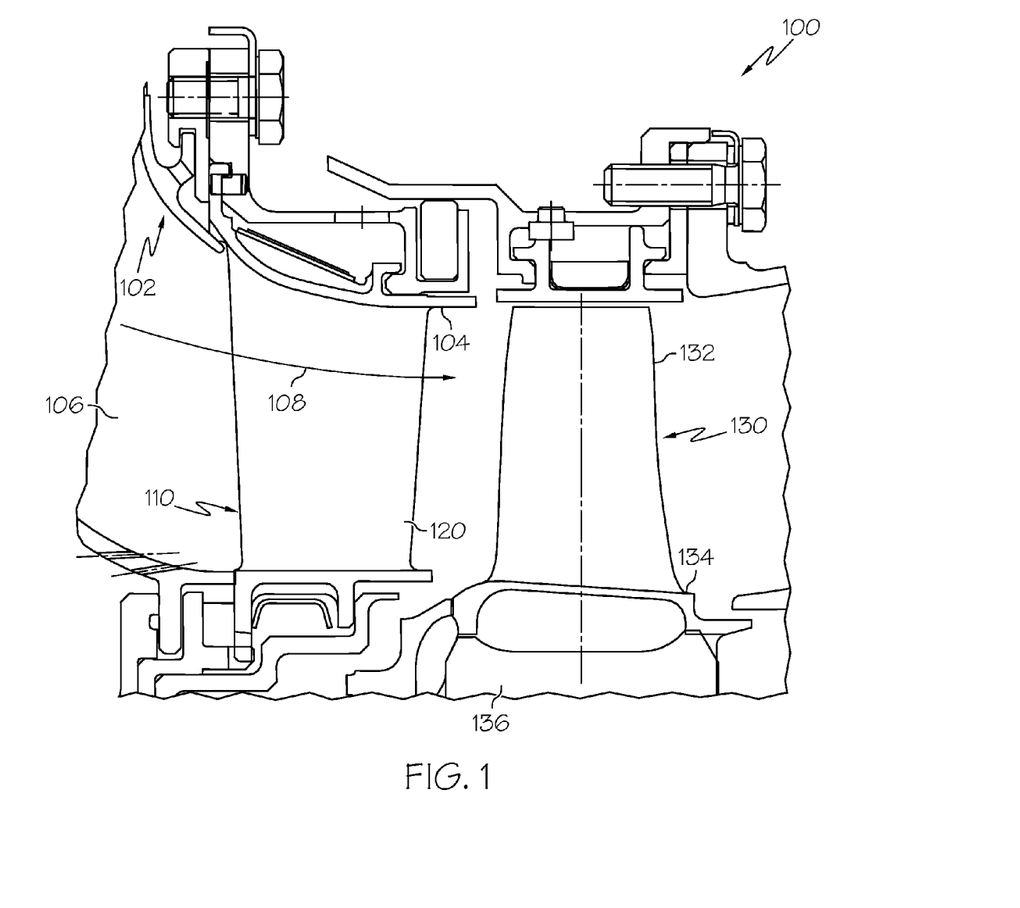
FIG. 1 is a partial cross-sectional view of a turbine section of an exemplary gas turbine engine assembly.

FIG. 1 is a fragmented vertical sectional view illustrating a partial turbine section 100 of a gas turbine engine assembly in accordance with an exemplary embodiment. The turbine section 100 and gas turbine engine assembly have an overall construction and operation that is generally understood by persons skilled in the art. In general terms, the turbine section 100 has a housing 102 with an annular duct wall 104 that defines a mainstream hot gas flow path 106 for receiving a flow of mainstream combustion gases 108 from an engine combustor (not shown). The housing 102 additionally houses at least one stator assembly 110 with stator vanes 120 and at least one turbine rotor assembly 130 with turbine rotor blades 132. The rotor blades 132 of the turbine rotor assembly 130 project radially outward from a turbine rotor platform 134 that is coupled to a turbine disk 136, which in turn circumscribes a shaft (not shown). During operation, the combustion gases 108 flow past axially spaced circumferential rows of stator vanes 120 and rotor blades 132 to drive the rotor blades 132 and the associated turbine rotor assembly 130 for power extraction. Other embodiments may be differently arranged.

Figure 2:
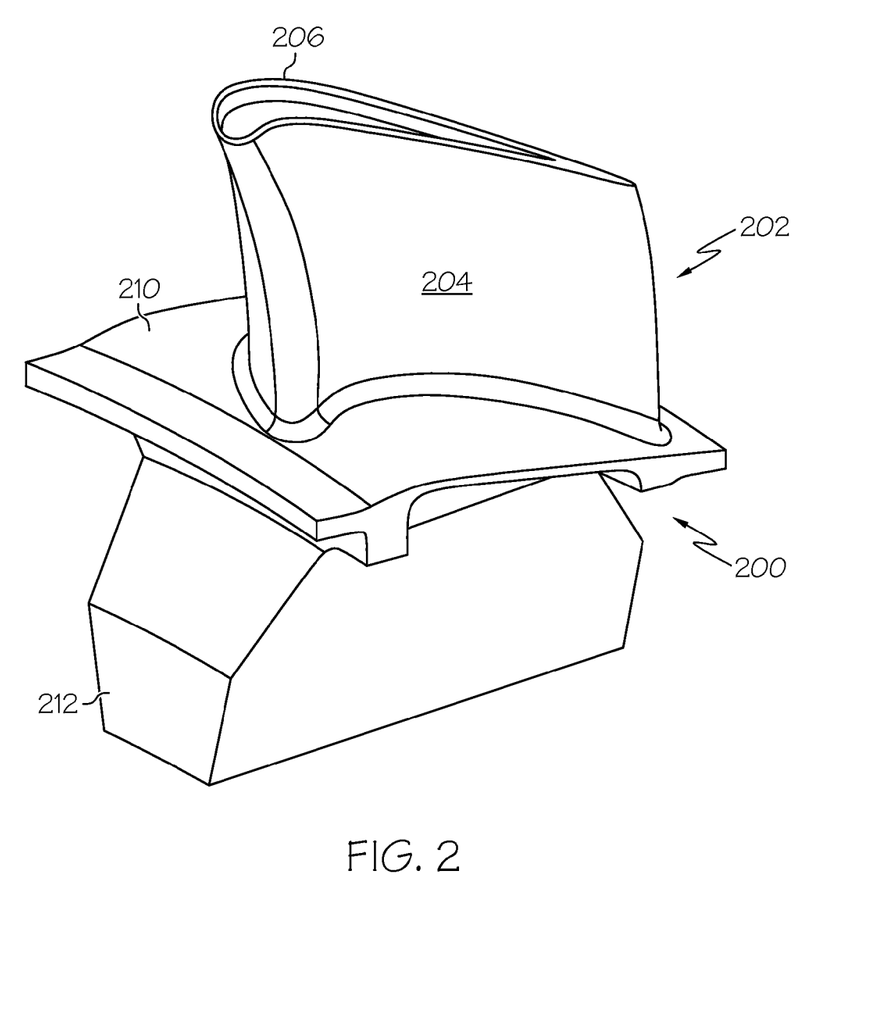
FIG. 2 is an isometric view of an exemplary turbine engine component.
Figure 3:
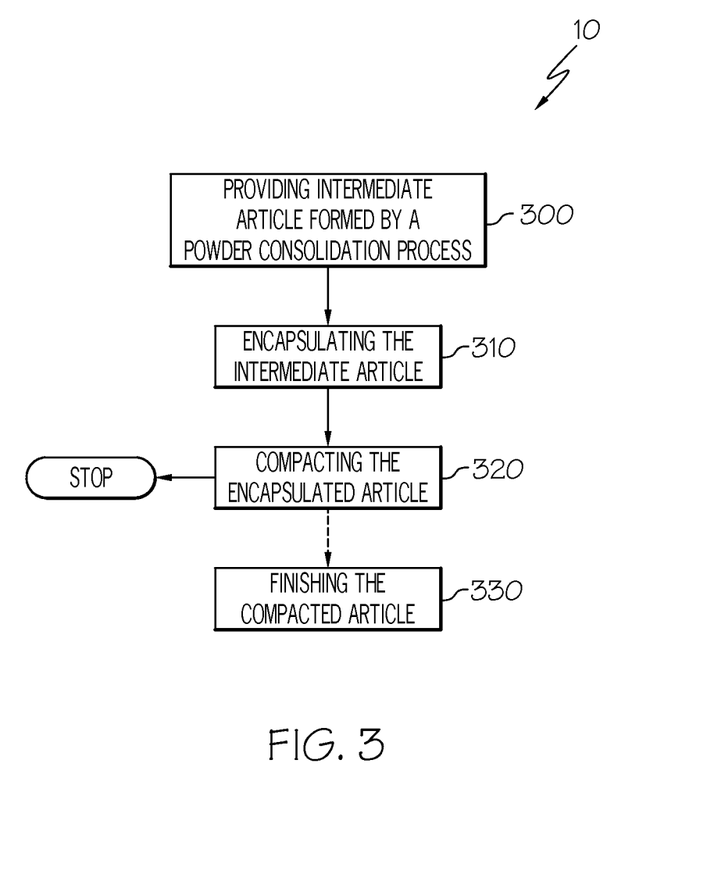
FIG. 3 is a flowchart of a method for manufacturing a titanium aluminide component (such as the exemplary turbine engine component of FIG. 2) from an intermediate article formed by a powder consolidation process, according to exemplary embodiments of the present invention.

FIG. 2 is an isometric view of a turbine component 200 in accordance with an exemplary embodiment and generally illustrates the relatively complex 3D geometric configuration typical of a turbine component, for example, that may be incorporated into the turbine section 100 of FIG. 1. Although the turbine component 200 in FIG. 2 is depicted as a rotor blade, such as rotor blade 132 (FIG. 1), the exemplary embodiments discussed herein are applicable to any type of gas turbine engine component, such as stator vanes 120 (FIG. 1), and other engine components, as well as other components as noted above.

Figure 12:
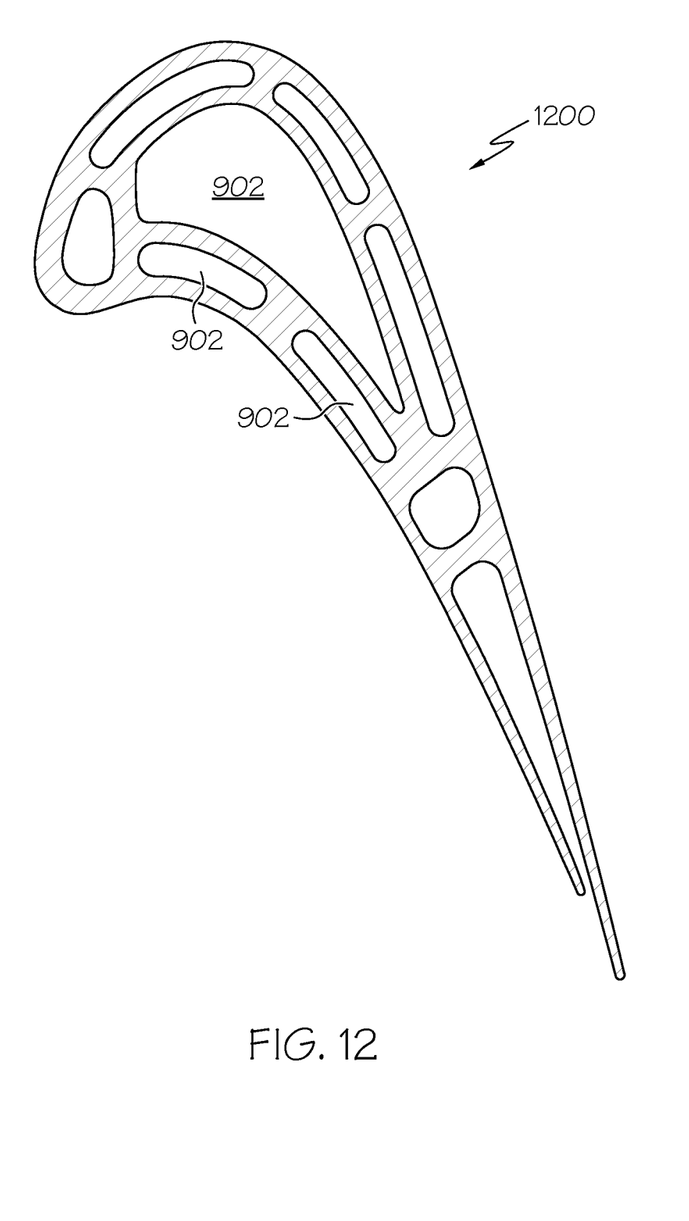
FIG. 12 is a cross-sectional view of a finished turbine component in the method of FIG. 3 in accordance with the alternate exemplary embodiment.

The turbine component 200 may include an airfoil 202 with a generally concave pressure side 204 and a generally convex suction side 206 opposed thereto. Each airfoil 202 may be coupled to a platform 210 that defines an inner boundary for the hot combustion gases that pass over airfoil 202 during engine operation. An attachment area 212 may be integrally formed on the underside of the platform 210 for mounting the turbine component 200 within the turbine section 100 (FIG. 1). As illustrated in FIG. 2, the turbine component 200 (and turbine component 800 in FIG. 8) may be generally solid throughout with an external surface. In an exemplary embodiment, as illustrated in FIG. 12 and hereinafter described, an exemplary turbine component 1200 may additionally include internal surfaces defining internal passages 902 including internal hollow areas, internal channels, internal openings, or the like, to provide, for example, a cooling flow during engine operation, for weight reduction, or otherwise. The turbine component illustrated in FIG. 12 has the external surface and a plurality of internal passages.

As shown in FIGS. 3 through 8, in accordance with exemplary embodiments, a method 10 for manufacturing a component, such as the turbine component 200 of FIG. 2, begins by providing an intermediate article formed by a powder consolidation process (step 300). The intermediate article may be an intermediate turbine article 500 adapted to be manufactured into the turbine component 200 of FIG. 2. The method 10 includes a number of intermediate stages during manufacture of the turbine component, illustrated in the cross-sectional views of FIGS. 5-7, prior to completion of the finished turbine component, illustrated in the cross-sectional view of FIG. 8.

The intermediate article is formed from a powdered build material comprising a titanium aluminide (TiAl) alloy. Titanium aluminide alloys maintain their structural integrity during high temperatures (above 700° C.) and for long exposure durations (hereinafter "long-term temperature capabilities"), in addition to being lightweight. TiAl based alloys have a strong potential to increase the thrust-to-weight ratio in the aircraft engine. This is especially the case with engine low pressure turbine blades and the high pressure compressor blades that are conventionally manufactured from Ni based superalloys, which are nearly twice as dense as TiAl based alloys. However, as noted previously, titanium aluminide alloys have relatively low ductility (i.e., (2%) when compared to Inconel 718 (3%) at room temperature (about 25 to about 35° C.) and poor oxidation and creep resistance when compared to high strength nickel-based superalloys. Therefore, it is important that titanium aluminide components used in high stress, high temperature gas turbine applications be substantially defect-free and oxidation protected.

Exemplary titanium aluminide alloys for the substrate build material are provided below along with their chemical composition, in atomic percent (at. %):

Titanium aluminide alloys

| Alloy | Composition, at. % | | | | | |
|---|---|---|---|---|---|---|
| | Al | Ti | Cr | Nb | Mn | W |
| TiAl$_3$ | 75 | 25 | — | — | — | — |
| Ti—Al—2Cr | 48 | 50 | 2.00 | — | — | — |
| TiAl—2Nb | 48 | 50 | — | 2.00 | — | — |
| Ti—Al48—2Cr—2Nb | 48 | 48 | 2.00 | 2.00 | — | — |
| XD | 47.39 | 49.24 | 2.04 | 1.14 | 0.21 | — |
| K5 | 46.5 | 48.3 | 2 | 3 | — | 0.2 |
| Alloy 7 | 46 | 48 | — | 5 | — | 1.0 |
| WMS | 47 | 50 | — | 2 | 1 | .5 |

Titanium aluminides have three major intermetallic compounds: gamma TiAl, alpha 2-Ti$_3$Al and TiAl$_3$. Ti-48Al-2Cr-2Nb (atomic percent), hereinafter named Ti-48-2-2 is a gamma titanium aluminide. Gamma aluminide turbine blades based on Ti-48-2-2 are nearly as strong as nickel based alloys up to 760° C. (1400° F.) and half the weight. The density of gamma TiAl is about 4.0 g/cm$^3$. Gamma TiAl also has excellent mechanical properties and oxidation and corrosion resistance at elevated temperatures (over 600° C.), which makes it a good replacement for traditional Ni based superalloy components in aircraft turbine engines.

Figure 5:
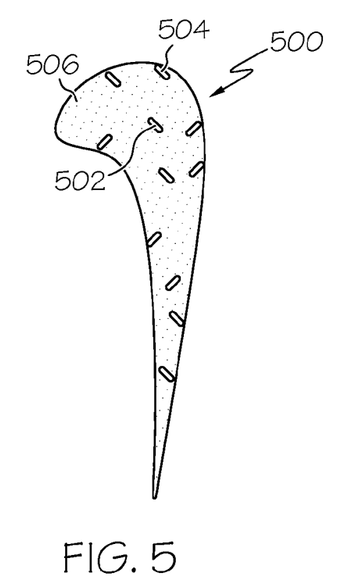
FIG. 5 is a cross-sectional view of a first intermediate turbine article in the method of FIG. 3 in accordance with an exemplary embodiment.

Powder consolidation processes for forming the intermediate article are well known in the art. Powder consolidation processes include, for example, additive manufacturing (AM) processes (including those which form "cores" for subsequent conventional casting) such as electron beam melting (EBM) or direct metal laser fusion (DMLF) in which sequential deposited layers of powdered build material are fused and solidified according to a three-dimensional model of the component, as hereinafter described. "Additive Manufacturing" is defined by the American Society for Testing and Materials (ASTM) as the "process of joining materials to make objects from 3D model data, usually layer upon layer, as opposed to subtractive manufacturing methodologies, such as traditional machining and casting." In an additive manufacturing process, for example, the intermediate turbine article 500 (FIG. 5) is produced according to the three-dimensional model. The three-dimensional model may be designed with computer aided design (CAD) software. The model may include 3D numeric coordinates of the entire configuration of the component including both external and internal surfaces (no internal surfaces are shown in FIG. 5) of an airfoil, platform and dovetail. The model may include a number of successive 2D cross-sectional slices that together form the 3D article and component.

Other examples of additive manufacturing techniques include: micro-pen deposition in which liquid media is dispensed with precision at the pen tip and then cured (actually a liquid media consolidation process); selective laser sintering in which a laser is used to sinter a powder media in precisely controlled locations; laser wire deposition in which a wire feedstock is melted by a laser and then deposited and solidified in precise locations to build the product (a wire feedstock consolidation process); and laser engineered net shaping. In general, additive manufacturing techniques provide flexibility in free-form fabrication without geometric constraints, fast material processing time, and innovative joining techniques. These are collectively referred to as "consolidation processes." A consolidation process may be a "powder consolidation process" in which the build material is powder, a "liquid media consolidation process" in which the build material is liquid media, or a "wire feedstock consolidation process" in which the build material is wire feedstock.

In a particular exemplary embodiment, direct metal laser fusion (DMLF) (an exemplary powder consolidation process) is used to produce the intermediate turbine article 500. DMLF is a commercially available laser-based rapid prototyping and tooling process by which complex parts may be directly produced by precision melting and solidification of metal powder into successive layers of larger structures, each layer corresponding to a cross-sectional layer of the 3D component. DMLF may include direct metal laser sintering (DMLS). DMLS is an additive manufacturing process that fuses powder metal in progressive deposit layers. Further details about an exemplary DMLS technique are provided below with reference to FIG. 4. Although the DMLF and DMLS processes are described herein, other suitable additive manufacturing techniques may be employed to form the intermediate article 500.

Figure 4:
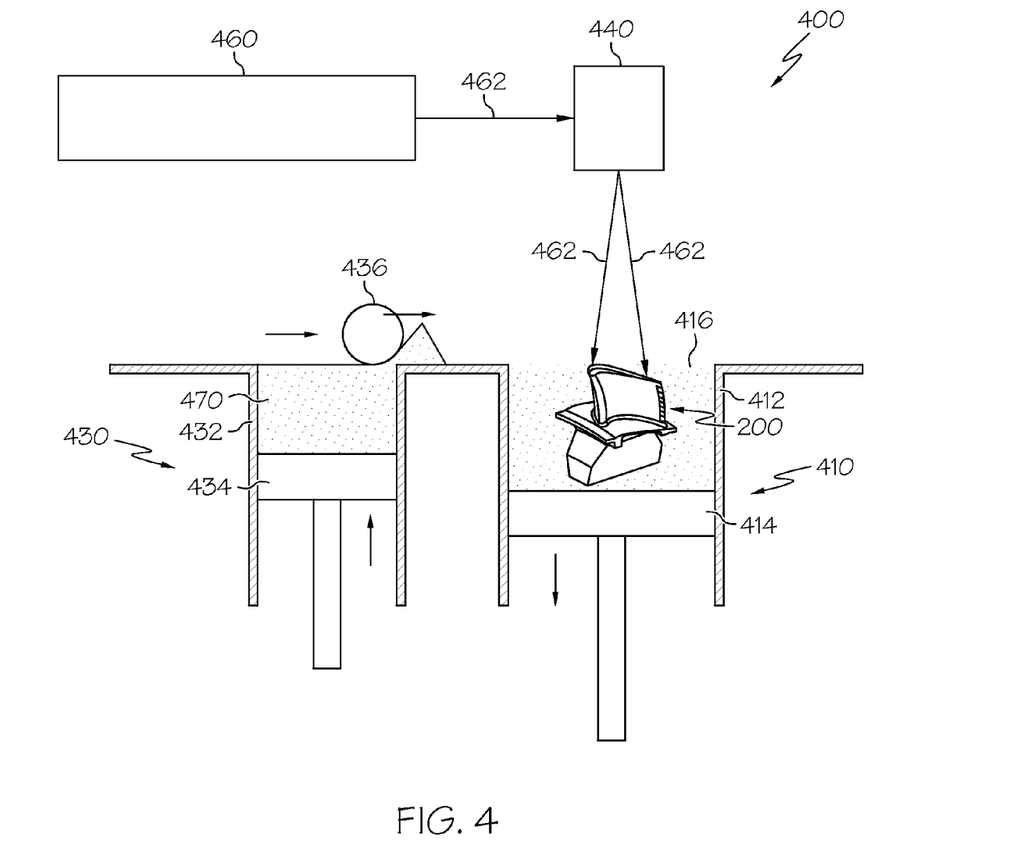
FIG. 4 is an exemplary system for forming an exemplary first intermediate turbine article.

FIG. 4 illustrates an exemplary DMLS system 400 for forming the intermediate turbine article 500 (FIG. 5) described above and provided in step 300 of method 10. As noted above, the intermediate article may be the intermediate turbine article 500 as shown in FIG. 5. The exemplary DMLS system 400 includes a fabrication device 410, a powder delivery device 430, a scanner 440, and a laser 460 and functions to produce the intermediate turbine article 500 from titanium aluminide build material 470.

The fabrication device 410 includes a build container 412 with a fabrication support 414 carrying the intermediate turbine article 500 to be formed from the build material 470. The fabrication support 414 is movable within the build container 412 in a vertical direction and is adjusted in such a way to define a working plane 416. The delivery device 430 includes a powder chamber 432 with a delivery support 434 that supports the build material 470 and is also movable in a vertical direction. The delivery device 430 further includes a roller or wiper 436 that transfers build material 470 from the delivery device 430 to the fabrication device 410.

During operation, the fabrication support 414 is lowered and the delivery support 434 is raised. The roller or wiper 436 scraps or otherwise pushes a portion of the build material 470 from the delivery device 430 to form the working plane 416 in the fabrication device 410. The laser 460 emits a laser beam 462, which is directed by the scanner 440 onto the build material 470 in the working plane 416 to selectively fuse the build material 470 into a cross-sectional deposit layer of the intermediate turbine article 500. More specifically, the laser beam 462 selectively fuses the powder of the build material 470 into larger structures by rapidly melting the powder particles. As the scanned laser beam 462 moves on, heat is conducted away from the previously melted area, thereby leading to rapid cooling and resolidification. As such, based on the control of the laser beam 462, each deposit layer of build material 470 will include unsintered build material 470 and sintered build material that forms the cross-sectional deposit layer of the intermediate turbine article 500. Any suitable laser and laser parameters may be used, including considerations with respect to power, laser beam spot size, and scanning velocity.

While additive manufacturing processes for forming the intermediate article have been described, other powder consolidation processes may be used to form the intermediate article as noted previously. For example, the intermediate article as exemplified by intermediate turbine article 500 (FIG. 5) may be formed by known wrought/forging processes, metal injection molding (MIM) processes, casting processes, and other processes that start with a powder build material to form a three-dimensional article. For example, metal injection molding (MIM) is a powder consolidation process in which finely-powdered metal is mixed with a measured amount of a binder material to comprise a "feedstock' or the build material capable of being handled by plastic processing equipment through a known process known as injection mold forming. As noted previously, the term "powder consolidation process" refers to a process in which a powdered build material is used to form an intermediate article that is used to manufacture the final component. The powdered build material is densified with bonding between adjacent atoms.

As a result of the powder consolidation process (and other consolidation processes), as noted previously, the intermediate article may include both internal porosity and cracks (internal defects 502), and surface porosity and cracks (or surface-connected defects 504) within the substrate 506 (See FIG. 5). The term "porosity" used herein refers to a defect that comprises small spaces or voids within the solid substrate 506. The term "cracks" used herein refers to linear defects or voids within the solid substrate 506, for example, with an aspect ratio greater than three to one. Thus, for high performance components that operate in high stress and high temperature environments, and must endure hot flow path gases and may endure high turbine rotational speeds (e.g., in the case of rotating turbine components), the intermediate turbine article 500 produced by a powder consolidation process (and other consolidation processes) may contain internal and surface-connected defects and thus are unsuitable for use without further processing.

Figure 6:
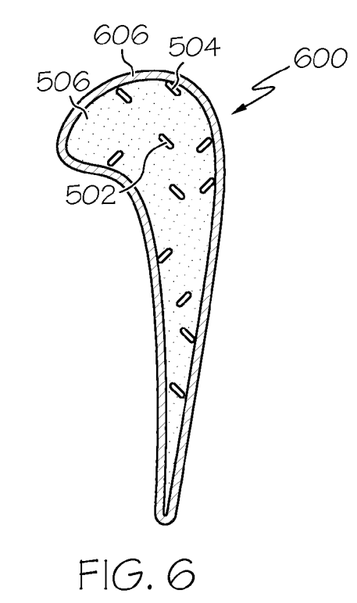
FIG. 6 is a cross-sectional view of an encapsulated turbine article after encapsulation of the intermediate turbine article of FIG. 5 in the method of FIG. 3 in accordance with an exemplary embodiment.

In a subsequent step 310 and additionally referring to FIG. 6, an encapsulated article (as exemplified by encapsulated turbine article 600) is produced by encapsulating the intermediate article 500 (FIG. 5) with an encapsulation layer 606. The intermediate article may be encapsulated by forming the encapsulation layer on at least one surface of the intermediate article. In an embodiment, the intermediate article may be included within the encapsulation layer, i.e., surrounded by the encapsulation layer as illustrated in FIG. 6. As noted above, the intermediate article provided in step 300 may have internal porosity and cracks 502, and surface porosity and cracks 504 in the substrate 506. The encapsulation layer 606 functions to effectively convert surface porosity and cracks into internal porosity and cracks. For example, the surface porosity and cracks 504 of FIG. 5 are effectively internal porosity and cracks in FIG. 6 as a result of the encapsulation layer 606. The encapsulation process bridges and covers the porosity and cracks 504 in the external surface of the solidified substrate 506. In addition, the encapsulation layer increases oxidation resistance of the TiAl substrate. The encapsulation layer 606 may have a thickness of approximately 10-100 μm, although any suitable thickness may be provided.

According to exemplary embodiments, the encapsulation layer 606 of the encapsulated article 600 comprises an aluminum-containing encapsulation layer. The aluminum-containing encapsulation layer is compatible with the titanium aluminide substrate and is formed by an encapsulation process, as hereinafter described. In various embodiments, the aluminum-containing encapsulation layer comprises an aluminide encapsulation layer comprising TiAl, TiAl$_3$, or a combination thereof.

The TiAl encapsulation layer may be formed by suspending the intermediate article above a pack of simple aluminide vapor in vacuum, at about 1850° F. to about 1975° F. for about 430 minutes to about 450 minutes and a partial pressure of argon. The aluminide alloy vapor composition comprises about 55 to about 57 weight percent chromium and about 43 to about 45 weight percent aluminum for a total of 100 weight percent. The vapor coating mixture comprises about 66 to about 68 wt % aluminide alloy vapor composition and about 32 to about 34 wt % Al$_2$O$_3$. About 0.6 to about 1.2 grams/pound of NH$_4$Cl may be used as the activator.

The TiAl$_3$ encapsulation layer may be formed by a pack aluminizing process or an out of pack aluminizing process as known to one skilled in the art, followed by a diffusion heat treatment at about 1125 to about 1175° F. for about 7 to about 9 hours. The TiAl$_3$ encapsulation layer comprises about 75 at % aluminum and 25 at % titanium. As the TiAl$_3$ intermetallic is very brittle, the encapsulated article should be carefully handled.

An aluminide encapsulation layer may be used to encapsulate an external surface of the intermediate article, an internal surface (if present) as hereinafter described, or both the external and internal surfaces of the intermediate article (see, e.g., FIG. 11).

In another exemplary embodiment, the aluminum-containing encapsulation layer comprises MCrAlY wherein M comprises nickel, cobalt, or a combination of nickel and cobalt. An exemplary MCrAlY encapsulation layer for a TiAl intermediate article includes, for example, Co27Cr9Al0.5Y, Ni30Cr11Al0.5Y, Co32Ni21Cr8Al0.5Y, and Ni23Co18Cr12.5Al0.5Y. The MCrAlY encapsulation layer may be formed on the external surface of the intermediate article by applying the MCrAlY encapsulation layer by, for example, EBPVD, cathodic arc or magnetron sputtering processes. Thermal spray processes such as, for example, LPPS, HVOF, and Ar-shrouded plasma spray may also be used to form the MCrAlY encapsulation layer. Such processes are well known to one skilled in the art.

Exemplary EBPVD conditions for applying the MCrAlY encapsulation layer on the external surface of the intermediate article comprising a titanium aluminide alloy are as follows:
Deposition time: about 15 to about 50 minutes
EB gun voltage: about 8 kV to about 12 kV
EB gun current: about 600 mA to about 1000 mA
Pre-Heating temperature: about 1500° F. to about 1800° F.
Vacuum: about 3.0e-4 Torr to about 3.0e-6 Torr
The thickness of the MCrAlY encapsulation layer formed or applied by EBPVD on the external surface of the intermediate article of a titanium aluminide alloy may be about 1 mil to about 3 mils, although other thicknesses may be used. It is to be understood that other EBPVD process conditions as known to one skilled in the art may be used for forming the MCrAlY encapsulation layer on the external surface of the intermediate article comprising the titanium aluminide alloy.

Exemplary magnetron sputtering conditions for forming or applying the MCrAlY encapsulation layer on the exterior surface of the intermediate article are as follows:
Cathode power: about 2 kW to about 4 kW
Cathode current: about 4 A to about 10 A
Argon pressure: about 0.2 Pa to about 2.0 Pa
Pre-Heating temperature: about 480° F. to about 680° F.
Deposition Time: about 60 minutes to about 180 minutes.

The thickness of the MCrAlY encapsulation layer applied by the magnetron sputtering process on the exterior surface of the intermediate article comprised of a titanium aluminide alloy is about 1 mil to about 2 mils, although other thicknesses may be used. It is to be understood that other magnetron sputtering conditions may be used for forming the MCrAlY encapsulation layer on the external surface of the intermediate article comprising the titanium aluminide alloy.

In another exemplary embodiment, the aluminum-containing encapsulation layer comprises a TiAlCr encapsulation layer. Exemplary TiAlCr encapsulation layers include, for example, Ti34/38Al-12/16Cr, wt % and may be applied to the titanium aluminide intermediate article by, for example, EBPVD, cathodic arc, or magnetron sputtering physical vapor deposition processes. The MCrAlY and TiAlCr encapsulation layers may not be formed on the internal surface(s) of the internal passage(s) because it is very difficult to coat internal surfaces through physical vapor deposition processes.

Figure 7:
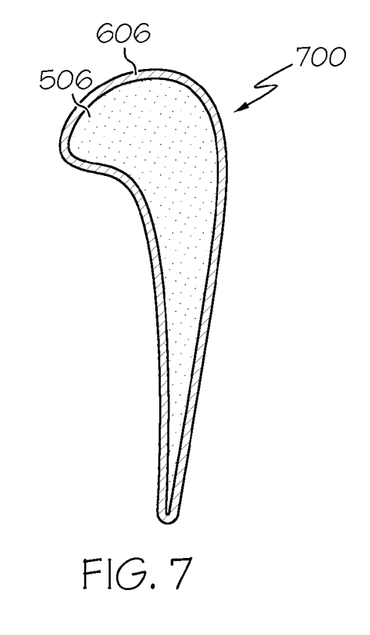
FIG. 7 is a cross-sectional view of a compacted turbine article after HIP processing of the encapsulated turbine article of FIG. 6 in the method of FIG. 3 in accordance with an exemplary embodiment.

In a subsequent step 320 and additionally referring to FIG. 7, a compacted turbine article 700 is formed by compacting the encapsulated article 600, for example, with a hot isostatic pressing (HIP) process in which the encapsulated article 600 (FIG. 6) is subjected to elevated temperatures and pressures over time. The HIP process may be performed at any temperature, pressure, and time that are suitable for forming a compacted solid having negligible porosity. In one embodiment, the HIP process may be performed at a processing temperature in a range of about 1000° C. to about 1300° C. and may be performed at a pressure in a range of about 1 ksi to about 25 ksi for a time period of about 1 to about 10 hours. In other embodiments, the HIP processing temperature, pressure, and time may be smaller or larger.

The hot isostatic pressing (HIP) process may be used to reduce or eliminate internal defects in the encapsulated article, whether the internal defects were originally present in the intermediate article or converted into internal defects by the previous encapsulation step used to bridge and cover the surface-connected defects, effectively converting the surface-connected defects into internal defects in preparation for the subsequent hot isostatic pressing (HIP) step. In general, the HIP process will not reduce defects such as porosity or cracks that are connected to the surface of the component. Instead, the encapsulation layer 606 provided in previous step 310 functions to internalize any such surface connected defects (e.g., surface connected porosity and cracks) such that the HIP process is effective at reducing or eliminating the internal defects in the intermediate article. The reduction in internal defects, such as porosity and cracks, resulting from the HIP process, as illustrated in FIG. 7, yields a substantially defect-free titanium aluminide component having improved overall mechanical properties, including tensile and stress rupture strengths.

Figure 8:
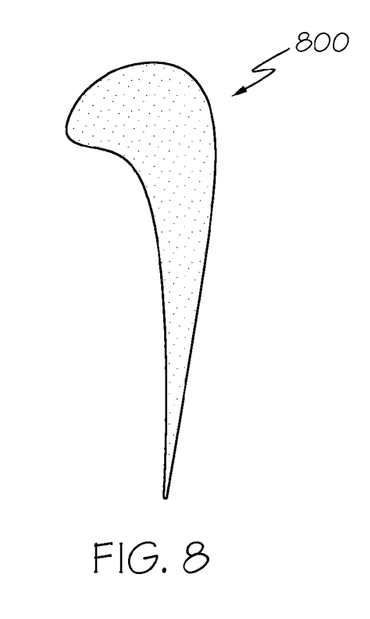
FIG. 8 is a cross-sectional view of a finished turbine component in the method of FIG. 3 after removal of the encapsulation layer from the compacted turbine article of FIG. 7 in accordance with an exemplary embodiment.

In a step 330 and additionally referring to FIG. 8, a finished turbine component 800 (shown with encapsulation layer removed) is produced by applying one or more finishing treatments to the compacted turbine article 700 (FIG. 7). The finishing treatments may include, for example, surface treatments, additional heat, aging, annealing, quenching. For example, a heat treatment may be performed at a temperature of about 2300° F. and 25 ksi and held for about four hours. Other heat treatment temperatures, pressures, and times may be higher or lower. Although step 330 is referred to as a finishing treatment, such treatments may also be used prior to step 310 or step 320. For example, degreasing (by, for example, ultrasonic cleaning) and grit blasting (with, for example, 220 aluminum oxide at about 60 psi) may be provided prior to step 330. In some exemplary embodiments, no such finishing treatments are necessary. The encapsulation layer 606 (FIG. 6) may remain on the finished turbine component 800 to provide oxidation protection to the titanium aluminide component and generally act as an environmental barrier coating (EBC) for the finished component (the encapsulation layer is not shown in FIG. 8). The encapsulated surface of the finished component is smooth, and may not require mechanical grinding or polishing or acid stripping to bring the component to final dimensions. Subsequent to any finishing steps, the exemplary finished turbine component 800 may be installed in a turbine section of a gas turbine engine, as shown in FIG. 1.

Figure 9:
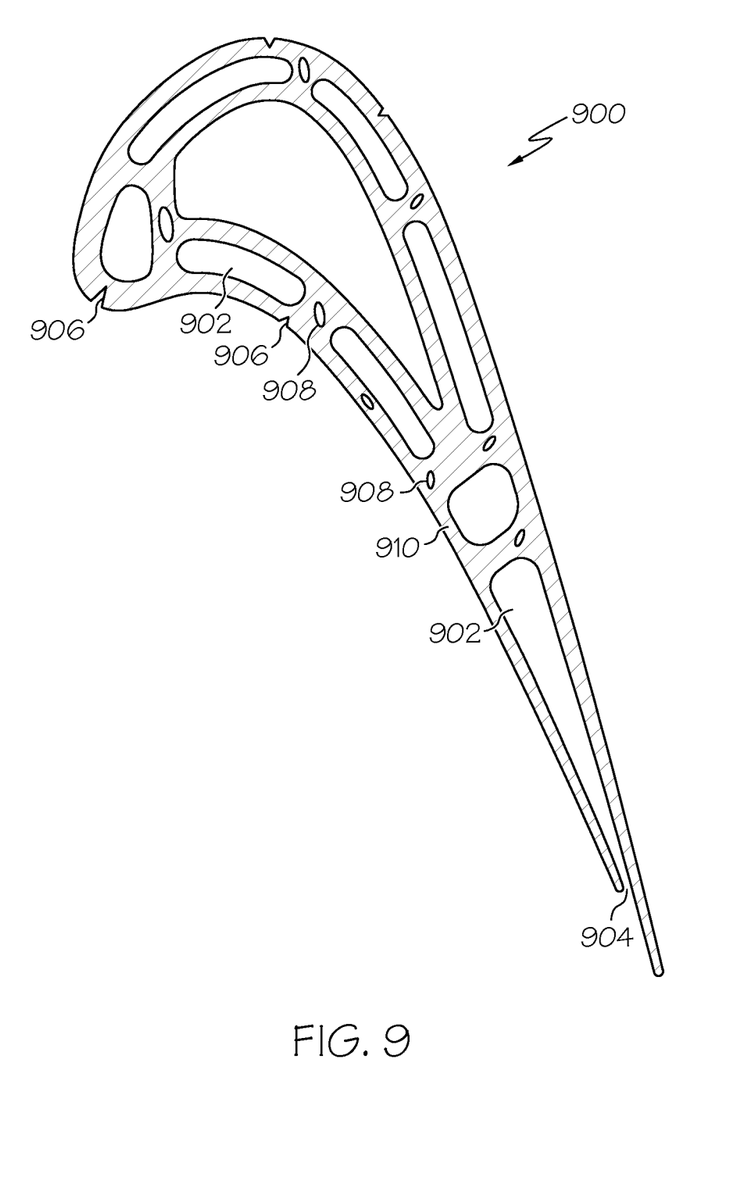
FIG. 9 is a cross-sectional view of an intermediate turbine article in the method of FIG. 3 in accordance with an alternate exemplary embodiment, the intermediate turbine article having internal and external surfaces.

As noted above, and illustrated in FIGS. 2 and 5-8, the intermediate turbine article 500 and finished turbine component (200 of FIGS. 2 and 800 of FIG. 8) may be generally solid throughout. However, the exemplary method 10 discussed above may be used to form titanium aluminide components with one or more internal passages 902. FIGS. 9-12 are successive cross-sectional views of the method 10 to manufacture a titanium aluminide turbine component with internal passages 902 such as cooling passages used in cooled high effectiveness advanced turbine (HEAT) blade and nozzle parts. Such turbine components may be capable of withstanding higher temperatures and stresses, thereby leading to further improvements in engine performance. For example, FIG. 9 shows an intermediate turbine article 900 formed by a powder consolidation process such as an additive manufacturing process, such as the DMLS process described above. The intermediate turbine article includes cooling passages that deliver a cooling flow to the finished turbine component via an inlet (not shown) during engine operation. The cooling flow exits out various cooling holes (not shown) and out the trailing edge exit slot 904. The cooling passages may be relatively complex and intricate for tailoring the use of the limited pressurized cooling air and maximizing the cooling effectiveness thereof and the overall engine efficiency. As a result of the additive manufacturing process, the intermediate turbine article 900 may include surface-connected porosity and cracks 906 and internal porosity and cracks 908 within the material substrate 910, making the intermediate turbine article 900 unsuitable for use without further processing. In a subsequent step, shown in FIG. 10, an encapsulated turbine article 1000 is produced by encapsulating the intermediate turbine article 900 in an encapsulation layer 1002. The encapsulation layer 1002 has the same composition according to exemplary embodiments as previously described and may be formed on the intermediate turbine article, for example, by the same encapsulation processes previously described.

Figure 10:
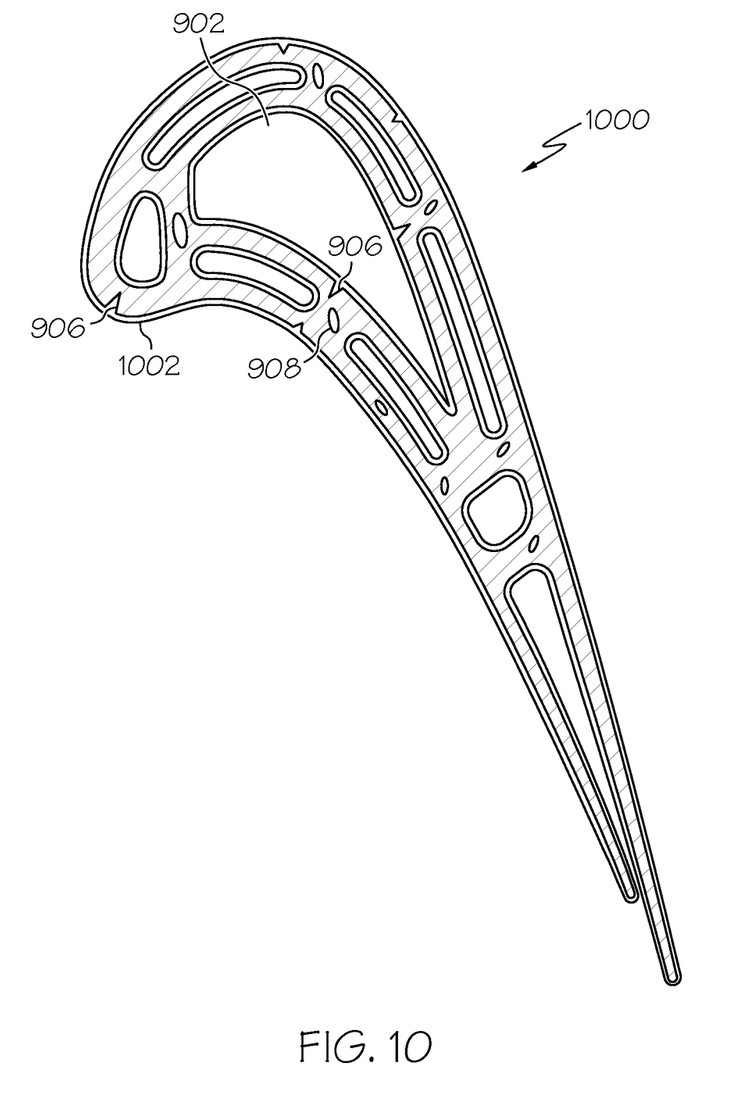
FIG. 10 is a cross-sectional view of an encapsulated turbine article after encapsulation of the intermediate turbine article of FIG. 9 in the method of FIG. 3 in accordance with the alternate exemplary embodiment.

In this exemplary embodiment, to encapsulate the internal surface(s) of the internal passage(s), an aluminide comprising the TiAl or the TiAl3 in the form of a Sermaloy™ J slurry available from, for example, Sermatech International or Praxair Surface Technologies, Inc. is applied on the internal surface(s) within the internal passages of the intermediate article by pumping the slurry through the internal passage(s) and thereafter heating the intermediate article with the applied slurry to a temperature of about 1400° F. to about 1800° F. in a protective atmosphere (vacuum or Ar) of a vacuum furnace, thereby forming the encapsulation layer on the inside surface(s) to ensure that the encapsulation layer 1002 spans the surface porosity and cracks 906 within the internal passages and on the external surface. The thickness of the aluminide encapsulation layer on the internal passage surfaces may be from about 25 to about 75 μm thick. The encapsulation layer 1002 effectively converts the surface porosity and cracks 906 into internal porosity and cracks.

Figure 11:
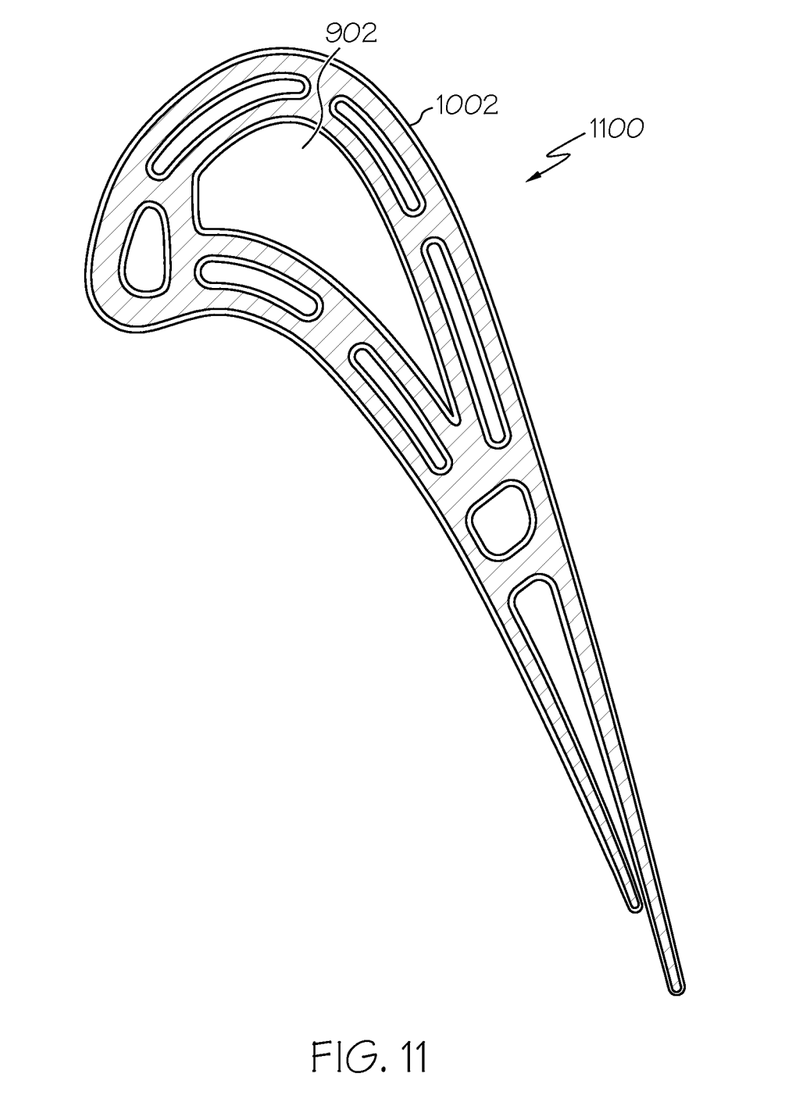
FIG. 11 is a cross-sectional view of a compacted turbine article after HIP processing of the encapsulated turbine article of FIG. 10 in the method of FIG. 3 in accordance with the alternate exemplary embodiment.

In the next step, as shown in FIG. 11, a compacted turbine article 1100 is formed by compacting the encapsulated turbine article 1000, for example, with the HIP process. As noted previously, the compaction process eliminates or substantially decreases the internal porosity and cracks. In a final step, as shown in FIG. 12, a finished component 1200 is produced with optional finishing processes as previously described, which may include removing the encapsulation layer 1002 (FIG. 12) in some embodiments.

Accordingly, exemplary embodiments may eliminate or reduce both internal and external defects in titanium aluminide components manufactured from articles formed by consolidation processes, thereby providing substantially defect-free titanium aluminide components. The substantially defect-free titanium aluminide components can operate at high stresses and in high temperature environments, able to endure hot flow path gases and high turbine rotational speeds if necessary while significantly reducing turbine engine weight, resulting in fuel and other cost savings. In addition, the method according to exemplary embodiments may be performed with fewer, if any, finishing steps.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. Various changes may be made in the function and arrangement of elements described in an exemplary embodiment without departing from the scope of the invention as set forth in the appended claims and their legal equivalents.

What is claimed is:

1. A method for manufacturing a titanium aluminide component, the method comprising the steps of:
   providing an intermediate article comprised of a titanium aluminide alloy and formed by a consolidation process using additive manufacturing;
   encapsulating the intermediate article with an aluminum-containing encapsulation layer; and
   compacting the intermediate article after the encapsulation step.

2. The method of claim 1, wherein the step of encapsulating the intermediate article comprises forming the aluminum-containing encapsulation layer with TiAl, TiAl$_3$, or a combination thereof to respectively form an aluminide encapsulation layer.

3. The method of claim 2, wherein the step of encapsulating the intermediate article comprises forming a TiAl aluminide encapsulation layer by a vapor aluminizing process.

4. The method of claim 3, wherein the step of encapsulating the intermediate article comprises forming the TiAl aluminide encapsulation layer having the following chemical composition: about 50 at. % aluminum and about 50 at. % titanium 5. The method of claim 1, wherein the step of encapsulating the intermediate article comprises forming a TiAl$_3$ aluminide encapsulation layer comprising about 75 at. % aluminum and about 25 at. % titanium.

6. The method of claim 1, wherein the step of encapsulating the intermediate article comprises forming a MCrAlY encapsulation layer wherein the M is nickel, cobalt, or a combination of nickel and cobalt.

7. The method of claim 6, wherein the step of encapsulating the intermediate article comprises forming the MCrAlY encapsulation layer using an encapsulation process selected from the group consisting of EBPVD, cathodic arc, magnetron sputtering, and a thermal spray process selected from the group consisting of LPPS, HVOF, and Ar-shrouded plasma spray.

8. The method of claim 6, wherein the step of encapsulating the intermediate article comprises encapsulating the intermediate article with the MCrAlY encapsulation layer comprising Co27Cr9Al0.5Y, Ni30Cr11Al0.5Y, Co32Ni21Cr8Al0.5Y, or Ni23Co18Cr12.5Al0.5Y.

9. The method of claim 1, wherein the step of encapsulating the intermediate article comprises encapsulating the intermediate article with a TiAlCr encapsulation layer.

10. The method of claim 9, wherein the step of encapsulating the intermediate article comprises encapsulating the intermediate article with the TiAlCr encapsulation layer by EBPVD, cathodic arc, and magnetron sputtering vapor deposition processes.

11. The method of claim 9, wherein the step of encapsulating the intermediate article comprises encapsulating the intermediate article with the TiAlCr encapsulation layer comprising Ti-34/38Al-12/16Cr, wt %.

12. The method of claim 1, wherein the step of encapsulating the intermediate article comprises encapsulating an external surface, an internal passage surface, or both the internal passage surface and the external surface of the intermediate article.

13. The method of claim 1, wherein the step of compacting the intermediate article after the encapsulating step comprises hot isostatic pressing (HIP) the intermediate article with the aluminum-containing encapsulation layer.

14. A method for manufacturing a titanium aluminide component from an intermediate article formed by a consolidation process, the method comprising the steps of:
encapsulating the intermediate article with an aluminum-containing encapsulation layer to form an encapsulated article, the intermediate article formed by the consolidation process using additive manufacturing and comprised of a titanium aluminide alloy material and the aluminum-containing encapsulation layer comprised of: (a) an aluminide encapsulation layer, (b) a MCrAlY encapsulation layer wherein the M comprises nickel, cobalt, or a combination of nickel and cobalt, or (c) a TiAlCr encapsulation layer; and
compacting the encapsulated article.

15. The method of claim 14, wherein the step of encapsulating the intermediate article comprises forming the aluminide encapsulation layer with TiAl, TiAl$_3$, or a combination thereof.

16. The method of claim 14, wherein the step of encapsulating the intermediate article comprises encapsulating the intermediate article with the MCrAlY encapsulation layer comprising Co27Cr9Al0.5Y, Ni30Cr11Al0.5Y, Co32Ni21Cr8Al0.5Y, or Ni23Co18Cr12.5Al0.5Y.Co 17. The method of claim 14, wherein the step of encapsulating the intermediate article comprises encapsulating an external surface, an internal passage surface, or both the internal passage surface and the external surface of the intermediate article.

18. The method of claim 14, wherein the step of compacting the encapsulated article comprises hot isostatic pressing (HIP) the encapsulated article.

\* \* \* \* \*